United States Patent
Fung et al.

(10) Patent No.: US 8,286,022 B2
(45) Date of Patent: *Oct. 9, 2012

(54) INTRA-PAIR DIFFERENTIAL SKEW COMPENSATION METHOD AND APPARATUS FOR HIGH-SPEED CABLE DATA TRANSMISSION SYSTEMS

(75) Inventors: Richard Fung, Markham (CA); Ramesh Senthinathan, Richmond Hill (CA); Nancy Chan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 564 days.

This patent is subject to a terminal disclaimer.

(21) Appl. No.: 12/352,114

(22) Filed: Jan. 12, 2009

(65) Prior Publication Data

US 2009/0121761 A1    May 14, 2009

Related U.S. Application Data (63) Continuation of application No. 11/010,159, filed on Dec. 10, 2004, now Pat. No. 7,493,509.

(51) Int. Cl.
*G06F 1/12* (2006.01)
(52) U.S. Cl. .......................... 713/401; 327/161; 327/295
(58) Field of Classification Search ................ 327/161, 327/295; 713/401
See application file for complete search history.

(56) References Cited

U.S. PATENT DOCUMENTS

| | | | |
|---|---|---|---|
| 6,353,340 B1 | 3/2002 | Satoh | |
| 6,448,815 B1 * | 9/2002 | Talbot et al. | 326/86 |
| 7,085,337 B2 | 8/2006 | Dyer et al. | |
| 2004/0130347 A1 | 7/2004 | Moll et al. | |
| 2004/0153936 A1 | 8/2004 | Smith et al. | |
| 2004/0165679 A1 | 8/2004 | Kwak | |
| 2006/0244505 A1 | 11/2006 | Fung et al. | |
| 2007/0164802 A1 | 7/2007 | Rea et al. | |

* cited by examiner

*Primary Examiner* — Albert Wang
(74) *Attorney, Agent, or Firm* — Faegre Baker Daniels LLP (57) ABSTRACT

A differential serial communication receiver circuit automatically compensates for intrapair skew between received differential signals on a serial differential communication link, with deterministic skew adjustment set during a receiver training period. Intrapair skew refers to the skew within a pair of differential signals, and is hence interchangeable with the term differential skew in the context of this document. During the receiver training period, a training data pattern is received, such as alternating ones and zeros (e.g., a D10.2 pattern as is known in the art), rather than an actual data payload. The differential serial communication receiver circuit includes a differential skew compensation circuit to compensate for intrapair skew. The differential skew compensation circuit receives a pair of complementary differential input signals including a noninverting input signal and an inverting input signal, and in response generates a skew compensated first differential output signal and a skew compensated second differential output signal. The differential skew compensation circuit compares the relative delay of the skew compensated first differential output signal and the skew compensated second differential output signal, and in response delays at least one of the noninverting input signal or the inverting input signal to reduce intrapair skew.

12 Claims, 10 Drawing Sheets

INTRA-PAIR DIFFERENTIAL SKEW COMPENSATION METHOD AND APPARATUS FOR HIGH-SPEED CABLE DATA TRANSMISSION SYSTEMS

RELATED APPLICATIONS

This application is a continuation of co-pending U.S. application Ser. No. 11/010,159, filed Dec. 10, 2004, entitled "INTRA-PAIR DIFFERENTIAL SKEW COMPENSATION METHOD AND APPARATUS FOR HIGH-SPEED CABLE DATA TRANSMISSION SYSTEMS", having as inventors Richard Fung et al., and owned by instant assignee and is incorporated herein by reference.

FIELD OF THE INVENTION

The invention relates generally to methods and an apparatus for differential serial communication, and in particular for reduction of intra-pair differential skew in a high-speed differential serial communication link.

BACKGROUND OF THE INVENTION

Typical data transmission speeds have advanced from only a few to tens of gigabits per second per integrated circuit pin and are expected to further increase as a result of recent advancements in communication and process technologies, as well as system architectures. Serial interface devices, rather than parallel interface devices, are generally used in such high-speed communications. This is because the maximum transmission distance and speed of parallel interface devices are limited due to crosstalk, inductive and capacitive noise coupling, parallel data skew, and the like between parallel conductors. By contrast, serial interface devices convert parallel data into serial data and then transmit differential serial data over a pair of conductors resulting in a small differential signal swing, a process often referred to as differential serial communication. A serial communication receiver receives high speed serial data and converts the serial data into lower speed parallel data.

Unlike parallel interface devices, which transmit a clock signal and data on a parallel link, serial interface devices may transmit data signals without an accompanying clock. Thus, a transmitter encodes the parallel data into serial data containing partial clock information and then transmits them across the link. Meanwhile, the receiver receives the data and then samples and recovers a clock signal and the data from the received data. A clock and data recovery apparatus performs the phase/frequency reconstruction of the clock signal and data recovery from the high speed encoded data signal containing the partial clock information.

However, the pair of conductors used for differential serial communication may be affected by their relative physical length, and by differential-mode interference from other communication devices. As a result, the serial differential communication link may suffer from imbalances that could cause a difference in propagation delay between the pair of conductors, thus causing a phase skew between the differential signals on the serial differential communication link. The phase skew between the differential serial signals is referred to herein as intrapair skew. Intrapair skew refers to a phase shifting within a pair of differential signals on the serial differential communication link. If the intrapair skew is severe enough, then reception of the differential signals becomes difficult or impossible, resulting in errors in the received data. Furthermore, intrapair skew may cause deterministic jitter, also resulting in an increased probability of errors in the received data. The conductor length mismatch, resulting in phase mismatch, is more likely to occur with longer cables. Operations at even higher frequencies further worsens these problems due to reduction of bit time, also resulting in increased bit error rate.

According to one method, compensation for inter-pair skew between differential serial communication links may be performed in order to reduce skew between two or more pairs of differential signals. The difference between inter-pair skew and intrapair skew is that the former refers to as the skew between multiple differential pairs, whereas the latter refers to the skew within a differential pair. A first-in, first-out (FIFO) elastic buffer receives signals from multiple differential serial communication links. The FIFO elastic buffer then timeshifts data received from the various differential serial communication links in an effort to compensate for the inter-pair skew between the serial communication differential links. However, these methods do not compensate for "intrapair skew" between the differential signals on a single differential serial communication link.

It is known to the inventors, intrapair skew reduction may be achieved through the use of a higher-grade cable, such as, for example, a cable having a conductor with a larger cross-sectional area, or with cables that are precise length-matched, using expensive manufacturing equipment. However, these methods introduce higher costs to the production of transmission cables. Furthermore, delay-matching transmission cables requires a high level of manufacturing control to perform. In addition, dynamic disturbances such as interference may not be compensated due to the static nature of the cable.

It is known to the inventors, the skew within a pair of differential signals, such as in a universal serial bus (USB), is continuously adjusted during data transmission if the skew is less than a prescribed value. If the skew is more than the prescribed value, then the method buffers the differential signals as opposed to performing skew compensation. However, methods that attempt to adjust skew during data transmission, for example, on-the-fly, may result in data transmission errors due to reduction of sampling margin for a given instance. In conclusion, continual adjustments attempting to correct intrapair skew during data transmission would increase the bit error rate (BER), especially during high speed data transmission.

BRIEF DESCRIPTION OF THE DRAWINGS

The present invention is illustrated by way of example and not limited in the accompanying figures, in which like reference numerals indicate similar elements and in which.

DETAILED DESCRIPTION OF THE PREFERRED EMBODIMENTS

A differential serial communication receiver circuit automatically compensates for intrapair skew between received differential signals on a serial differential communication link, with deterministic skew adjustment set during a receiver training mode. Intrapair skew refers to the skew within a pair of differential signals, and is hence interchangeable with the term differential skew in the context of this document. During the receiver training mode, a training data pattern is received, such as alternating ones and zeros (e.g., a D10.2 pattern as is known in the art), rather than an actual data payload. The differential serial communication receiver circuit includes a differential skew compensation circuit to compensate for intrapair skew. The differential skew compensation circuit receives a pair of complementary differential input signals including a noninverting input signal and an inverting input signal, and in response generates a skew compensated first differential output signal and a skew compensated second differential output signal. The differential skew compensation circuit compares the relative delay of the skew compensated first differential output signal and the skew compensated second differential output signal, and in response delays at least one of the noninverting input signal or the inverting input signal to reduce intrapair skew.

Among other advantages, during the receiver training period the differential serial communication receiver circuit compensates for problems and disturbances that cause intrapair skew. By adapting to these problems and disturbances associated with the pair of complementary differential input signals, such as electromagnetic interference, jitter and other causes of an imbalance in the pair of complementary differential input signals, data transmission errors will be reduced. Additionally, the differential serial communication receiver circuit may allow the physical length of the differential communication link to be increased in order to permit communication over longer distances. Furthermore, the transmission data rate may be increased, resulting in an increased data throughput while maintaining the prescribed bit error rate (BER) limit. Further yet, the pair of wires or any suitable cable does not require precision manufacturing tuning resulting in lower manufacturing costs for the cable and the overall system.

Figure 1:
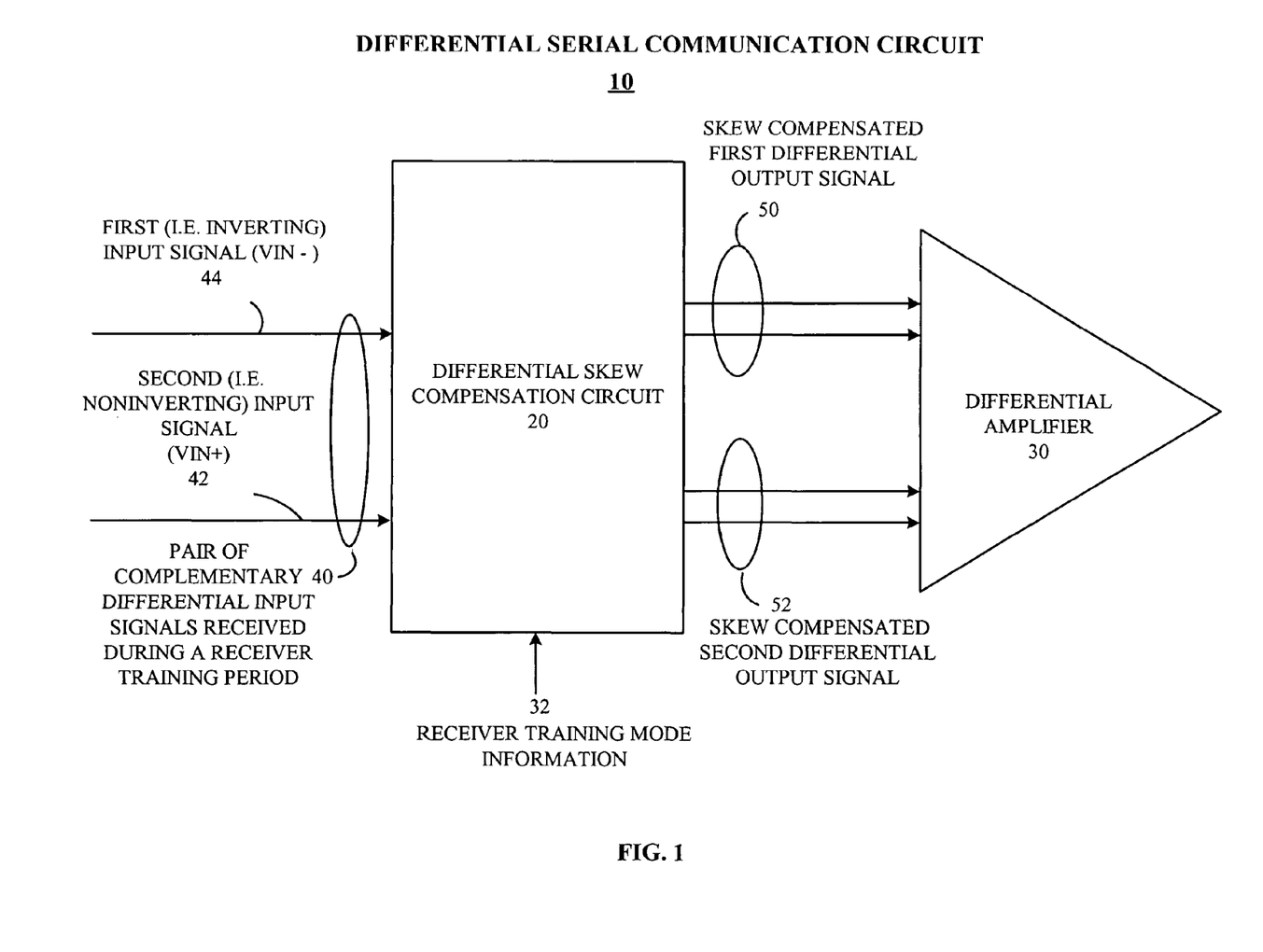
FIG. 1 is a block diagram of a differential serial communication circuit to compensate for intrapair skew.

FIG. 1 is a block diagram of a differential serial communication receiver circuit 10 including a differential skew compensation circuit 20 and a differential amplifier 30. The differential skew compensation circuit 20 compensates for differences in intrapair skew within a pair of complementary differential input signals 40, a first (i.e. inverting) input signal 44 and a second (i.e. noninverting) input signal 42, in response to receiver training information 32. Although the pair of complementary differential input signals 40 are described as noninverting and inverting, the signals may be complementary in any other suitable manner. The receiver training mode information 32 corresponds to the detection of intrapair skew as shown for example in the timing diagram 610 of FIG. 6. The pair of complementary differential input signals 40 include a noninverting input signal (VIN+) 42 and an inverting input signal (VIN−) 44. The differential skew compensation circuit 20, in response, may then provide a skew compensated first differential output signal 50 and a skew compensated second differential output signal 52 to the differential amplifier 30.

According to one embodiment, the differential skew compensation circuit 20 may be part of video graphics circuitry including, for example, a graphics coprocessor. The video graphics circuitry may be part of a computer system or other processor-based system that may include a central processing unit, the video graphics circuitry, system memory and other suitable peripheral circuits. In such systems, the central processing unit functions as a host processor, while the video graphics circuitry (e.g., a graphics coprocessor) functions as a loosely coupled coprocessor. Similarly, the differential skew compensation circuit 20 may be part of any computer component or peripheral device such as a hard drive, CD-ROM, modem, speaker, network interface or other suitable device. Additionally, the differential skew compensation circuit 20 may also be part of any electronic device such as a television, audio system, digital camera, audio system, personal digital assistant or other suitable device.

By way of example, the video graphics circuitry may be an integrated circuit on one or more semiconductor dies, such as an application-specific integrated circuit (ASIC). According to one embodiment, the differential skew compensation circuit 20 and the differential amplifier 30 are part of an integrated circuit, such as a graphics coprocessor circuit, in communication with a central processing unit via, for example, a Northbridge. For example, both the differential skew compensation circuit 20 and the differential amplifier 30 may reside on the same semiconductor die (ASIC) as the video graphics circuitries. Alternatively, the differential skew compensation circuit 20 and the differential amplifier 30 may be separate and connected through board-level or package-level traces. Additionally, the video graphics circuitry may include memory, such as dynamic random access memory (DRAM). This memory may reside on the same semiconductor die (ASIC) as the video graphics circuitry or it may be separate and connected through board-level or package-level traces.

The various elements of the differential serial communication receiver circuit 10 are connected by a plurality of links. The links may be any suitable mechanisms for conveying electrical signals or data, as appropriate. According to one embodiment, the interface between the differential skew compensation circuit 20, the differential amplifier 30 and a differential serial communication transmitter (not shown) for providing the pair of complementary differential input signals 40 may be a host processor to graphics coprocessor interface (e.g., via a Northbridge), such as a PCI bus, an AGP bus, a PCI-E bus, an $I^2C$ (IC to IC) bus or any other suitable type of bus including a USB, either standardized or proprietary. Alternatively, theses interfaces may be integrated circuit interconnections within an application-specific integrated circuit.

Figure 2:
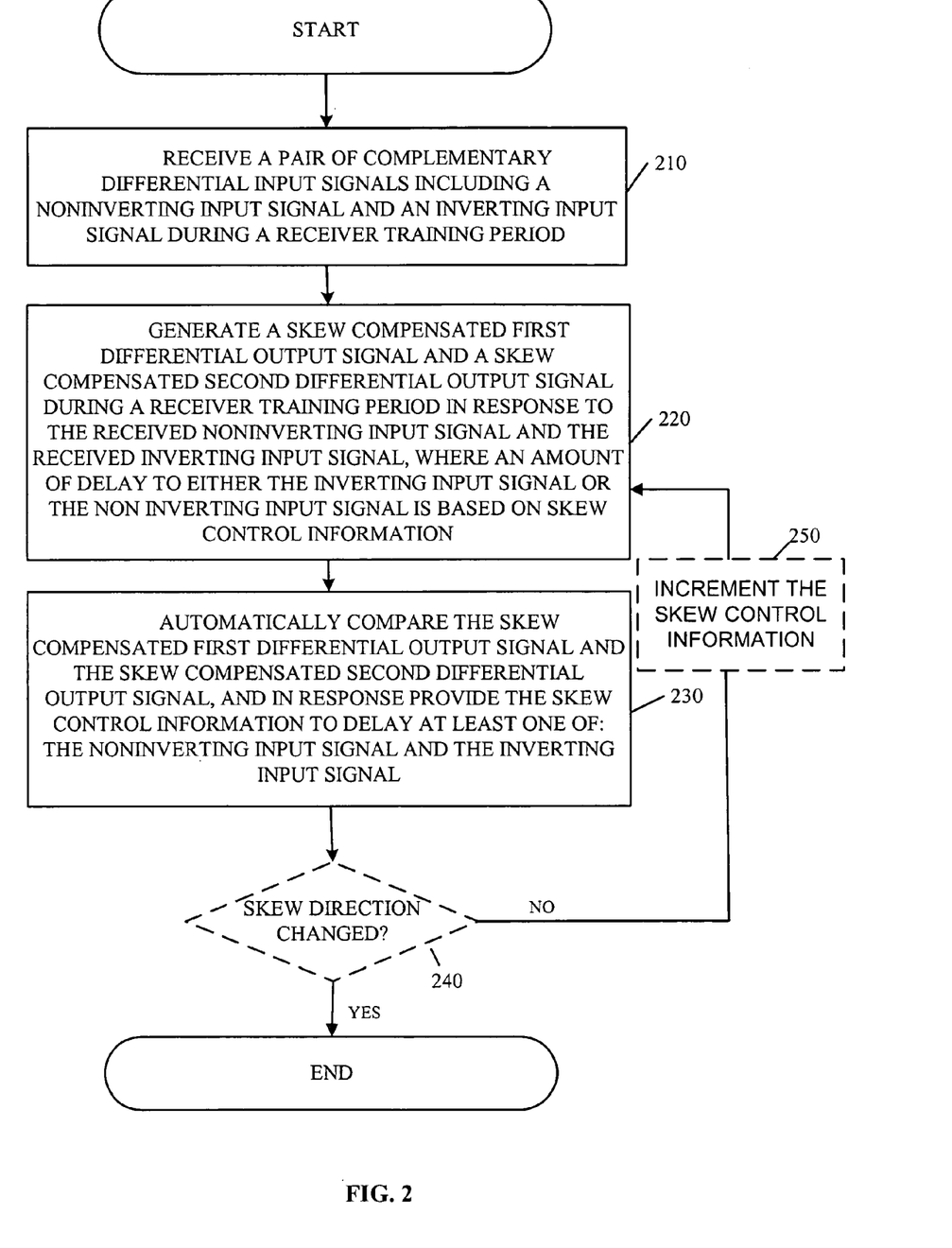
FIGS. 2 and 2A are flow charts illustrating one example of an adaptive differential serial communication method to compensate for intrapair skew according to one exemplary embodiment of the invention.
Figure 2A:
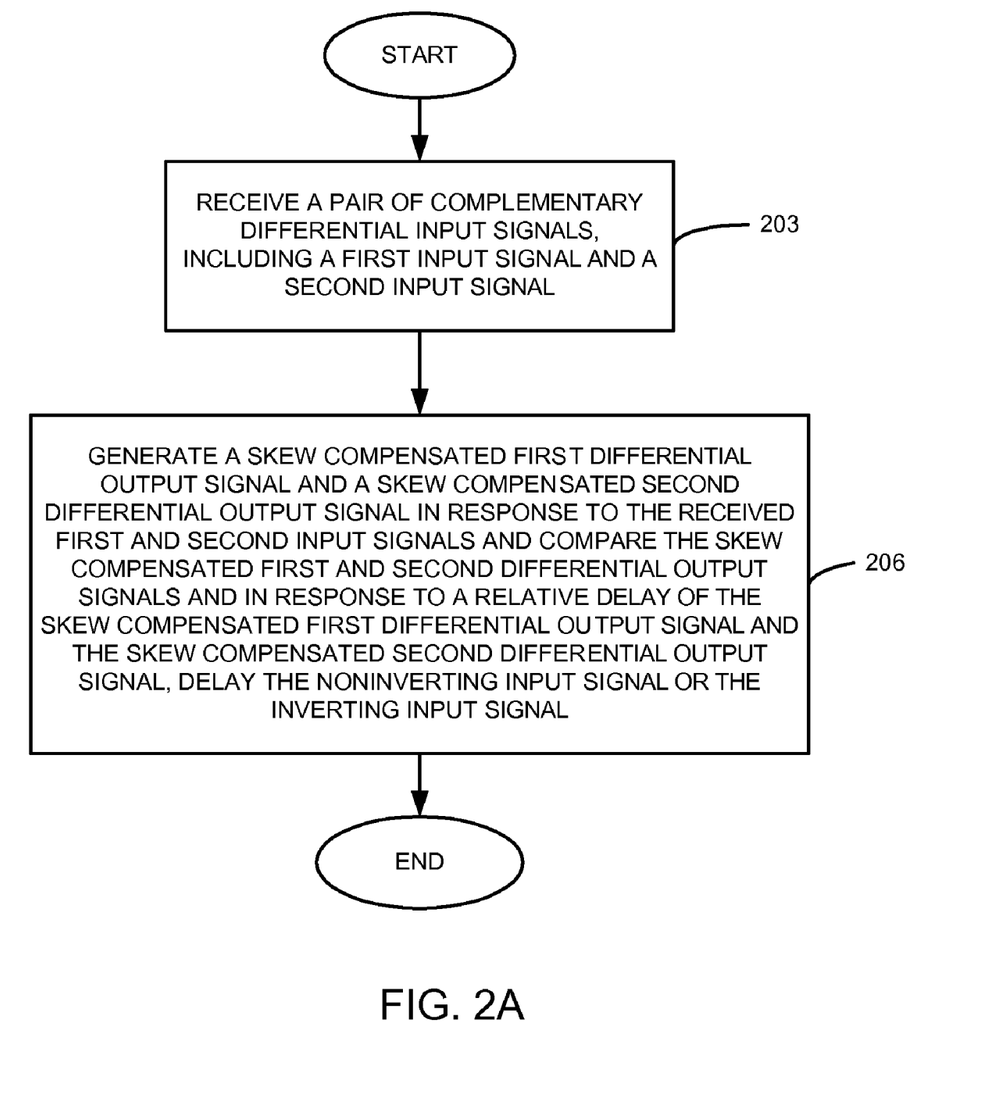

FIGS. 2 and 2A illustrates methods for a differential skew compensation. The methods may be carried out by the differential skew compensation circuit 20, but any other suitable structure may be also used. It will be recognized that the methods, beginning with blocks 210 and 205, will be described as a series of operations, but the operations may be performed in any suitable order and may be repeated in any suitable combination.

As shown in block 203 of FIG. 2A, the differential skew compensation circuit 20 receives the pair of complementary differential input signals 40, including the first input signal 44 and the second input signal 42.

As shown in block 206, the differential skew compensation circuit 20 generates the skew compensated first differential output signal 50 and the skew compensated second differential output signal 52 in response to a relative delay based on a comparison of the skew compensated first differential output signal 50 and the skew compensated second differential output signal 52 and, in response, delay at least one of: the first input signal 44 and the second input signal 42.

Figure 7:
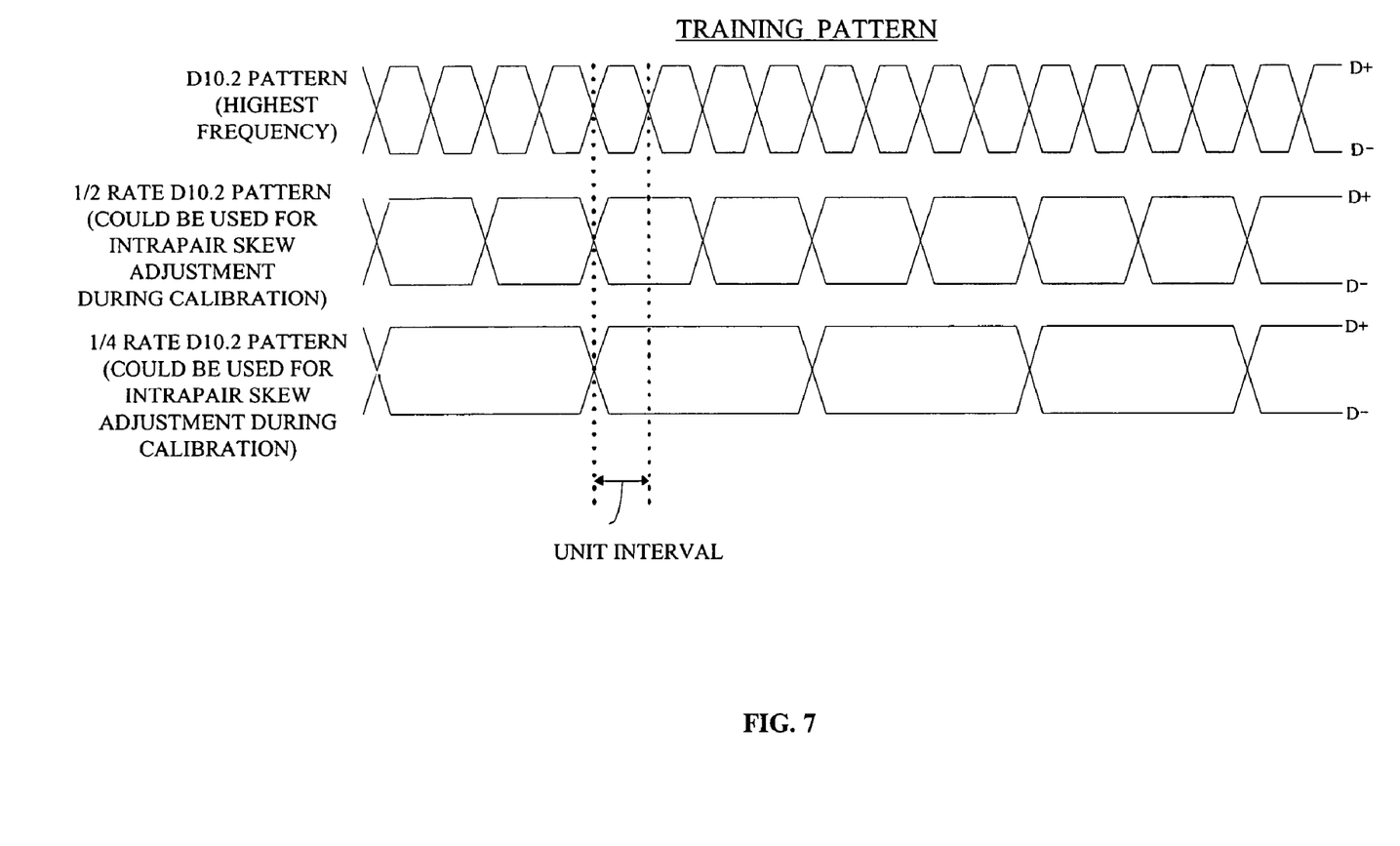
FIG. 7 is a training pattern diagram according to one exemplary embodiment of the invention.

As shown in block 210 of FIG. 2, the differential skew compensation circuit 20 receives the pair of complementary differential input signals 40 including the noninverting input signal (VIN+) 42 and the inverting input signal (VIN−) 44 during a receiver training mode. The receiver training mode is established in response to the receiver training mode information 32. As previously stated, although not shown in FIG. 1, the differential amplifier 30 may be in communication with a differential transmitter, located, for example, in a graphics processor, a Northbridge circuit or any suitable circuit, as is commonly known in the art, to receive the noninverting input signal 42 and the inverting input signal 44. During the receiver training mode, a training data pattern, such as alternating ones and zeros are transmitted as shown in FIG. 7 rather than an actual data payload.

As shown in block 220, the differential skew compensation circuit 20 generates the delayed first differential output signal 50 and the delayed second differential output signal 52 in response to receiving the noninverting input signal 42 and the inverting input signal 44.

As shown in block 230, the differential skew compensation circuit 20 compares a relative delay of the delayed first differential output signal 50 and the delayed second differential output signal 52. In response, if skew exists between the delayed first differential output signal 50 and the delayed second differential output signal 52, the skew compensation circuit 20 further delays at least one of the inverting input signal 44 and/or the noninverting input signal 42. For example, the differential skew compensation circuit 20 delays the inverting input signal 44 when the second differential output signal 52 is delayed relative to the first differential output signal 50. Additionally, the differential skew compensation circuit 20 delays the noninverting input signal 42 when the first differential output signal 50 is delayed relative to the received skew compensated second differential output signal 52.

As shown in optional blocks 240 and 250, if the skew direction changes, then the intrapair skew may be determined to be sufficiently reduced, and processing ends. For example, if the skew direction changes, then this may indicate that the intrapair skew has been reduced within an incremental amount. The differential skew compensation circuit 20 may delay by an incremental amount, such as a bit period, or a fraction of a bit period over one or more iterations. Alternatively, the delay may be such that the intrapair skew is substantially reduced or eliminated. If the skew direction does not change, then the intrapair skew is not reduced within the desired range or threshold and the differential skew compensation circuit 20 increment the appropriate skew information at step 250.

Figure 3:
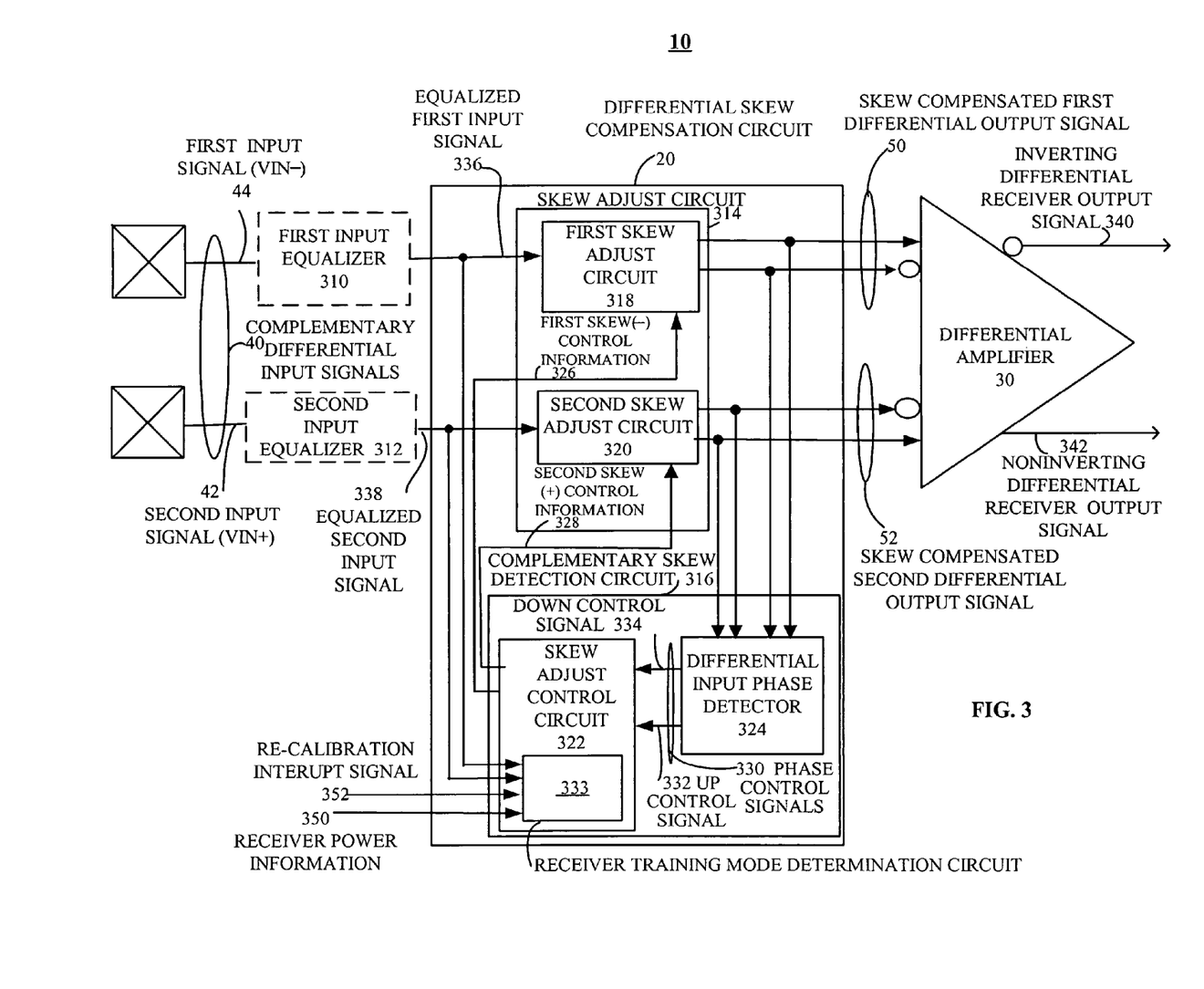
FIG. 3 is a block diagram of a differential serial communication circuit to compensate for intrapair skew according to another embodiment of the invention.

FIG. 3 is a block diagram of the differential serial communication receiver circuit 10 further including an optional inverting input equalizer 310 and an optional noninverting input equalizer 312. The differential skew compensation circuit 20 further includes a skew adjust circuit 314 and a complementary skew detection circuit 316. The skew adjust circuit 314 further includes an inverting skew adjust circuit 318 and a noninverting skew adjust circuit 320. The complementary skew detection circuit 316 further includes a skew adjust control circuit 322 and a differential input phase detector 324. The skew adjust control circuit 322 further includes a receiver training mode determination circuit 333.

The inverting skew adjust circuit 318 receives the inverting input signal 44 and inverting skew control information 326, and in response produces the delayed first differential output signal 50. The noninverting skew adjust circuit 320 receives the noninverting input signal 42 and noninverting skew control information 328, and in response produces the delayed second differential output signal 52. The skew compensated first differential output signal 50 and the skew compensated second differential output signal 52 make up the skew-compensated signals.

Figure 6:
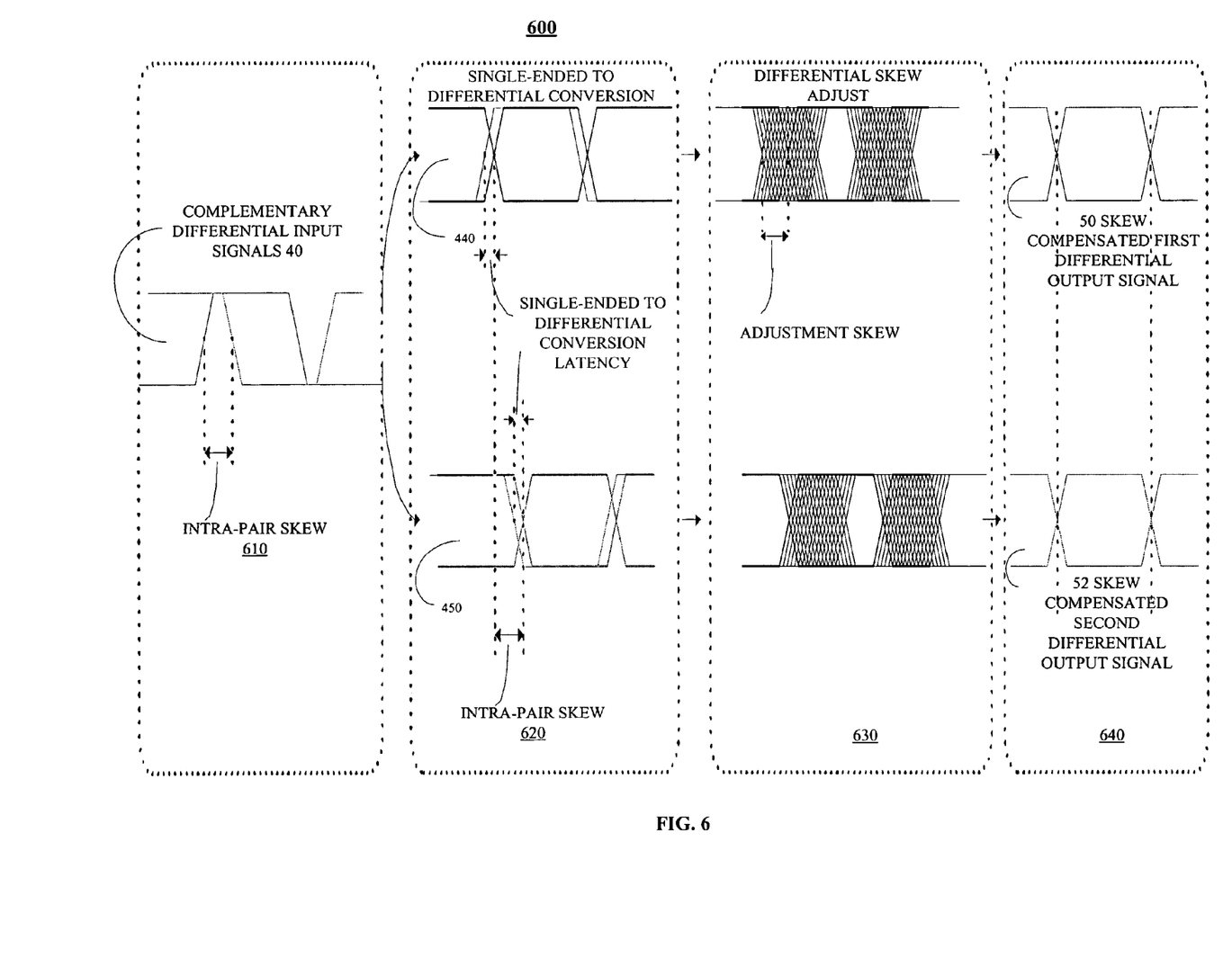
FIG. 6 is a signal timing diagram according to one exemplary embodiment of the invention.

The complementary skew detection circuit 316 produces the inverting skew control information 326 to cause the inverting skew adjust circuit 318 to increase delay on the noninverting input signal 44 when the received skew compensated second differential output signal 52 is delayed relative to the received skew compensated first differential output signal 50. In response to the inverting skew control information 326, the inverting skew adjust circuit 318 produces the skew compensated first differential output signal 50. Analogously, the complementary skew detection circuit 316 produces the noninverting skew control information 328 to cause the noninverting skew adjust circuit 320 to delay the noninverting input signal 42 when the received skew compensated first differential output signal 50 is delayed relative to the received skew compensated second differential output signal 52. In response to the noninverting skew control information 328, the noninverting skew adjust circuit 320 produces the skew compensated second differential output signal 52. FIG. 6 illustrates a corresponding differential skew adjust timing diagram 630. The skew adjust control circuit 322 delays at least one of the noninverting input signal 42 or the inverting input signal 44. According to one embodiment, the skew adjust control circuit 322 delays only one of the noninverting input signal 42 or the inverting input signal 44, but not both, in order to reduce intrapair skew.

The differential input phase detector 324 receives the skew compensated first differential output signal 50 and the skew compensated second differential output signal 52, and in response produces the phase control signals 330. The differential input phase detector 324 receives as input differential input signals as is known in the art and is shown in the single-ended to differential conversion timing diagram 620 of FIG. 6. The output of the differential input phase detector 324, according to one embodiment, may produce up control signal 332 and down control signal 334. For example, the up control signal 332 may represent a pulse to incrementally increase the delay of the skew compensated first differential output signal 50, whereas the down control signal 334 may represent a pulse to incrementally increase the delay of the skew compensated second differential output signal 52. According to one embodiment, if the intrapair skew between the skew compensated first differential output signal 50 and the skew compensated second differential output signal 52 exceeds a skew threshold, then the skew up control signal 332 may represent, for example, a pulse. If, however, the skew compensated first differential output signal 50 is phase delayed from the skew compensated second differential output signal 52, then the skew down control 334 may, for example, represent a pulse.

The skew adjust control circuit 322 receives the phase control signals 330, and in response produces the inverting skew control information 326 and the noninverting skew control information 328 to delay either the inverting input signal 44 or the noninverting input signal 42, respectively. The receiver training mode determination circuit 333 receives the (equalized) noninverting input signal 338 and inverting input signal 336 to detect signal activity, receiver power information 350 and a re-calibration interrupt signal 352. The receiver power information 350 indicates power is applied to the receiver circuit 10 to assist in determining the receiver training mode. The skew adjust control circuit 322 may be one or more suitable combinational logic, sequential logic, programmed processors, such as a microprocessor, a microcontroller or a digital signal processor (DSP), and therefore includes associated memory containing instructions that, when executed, cause the processor to carryout the operations described herein. In addition, the skew adjust control circuit 322, as used herein, may include discrete logic state machines or any other suitable combination of hardware, software, middleware and/or firmware. According to one embodiment, the skew adjust control circuit 322 may be part of an application-specific integrated circuit.

According to one embodiment, the skew adjust control circuit 322 provides control signals to delay the noninverting input signal 42 and/or the inverting input signal 44, such that the skew between the skew compensated first differential output signal 50 and the skew compensated second differential output signal 52 is minimized as shown in the timing diagram 640 of FIG. 6. For example, if the skew adjust control circuit 322 determines that the phase skew between the received skew compensated first differential output signal 50 and the received skew compensated second differential output signal 52 approaches, equals or exceeds the data transmission bit period, or a fraction of the bit period, the skew adjust control circuit 322 may compensate for the phase skew and thus calibrate the phase skew appropriately.

The differential skew compensation circuit 20 compensates for the phase skew between the skew compensated first differential output signal 50 and the skew compensated second differential output signal 52 during a receiver training period. For example, the transmitter (not shown) may transmit a pattern of alternating ones and zeros as the complementary differential input signal 40 as shown in FIG. 7. The skew adjust control circuit 322 calibrates the skew adjust circuit 314 during this receiver training period.

Figure 8:
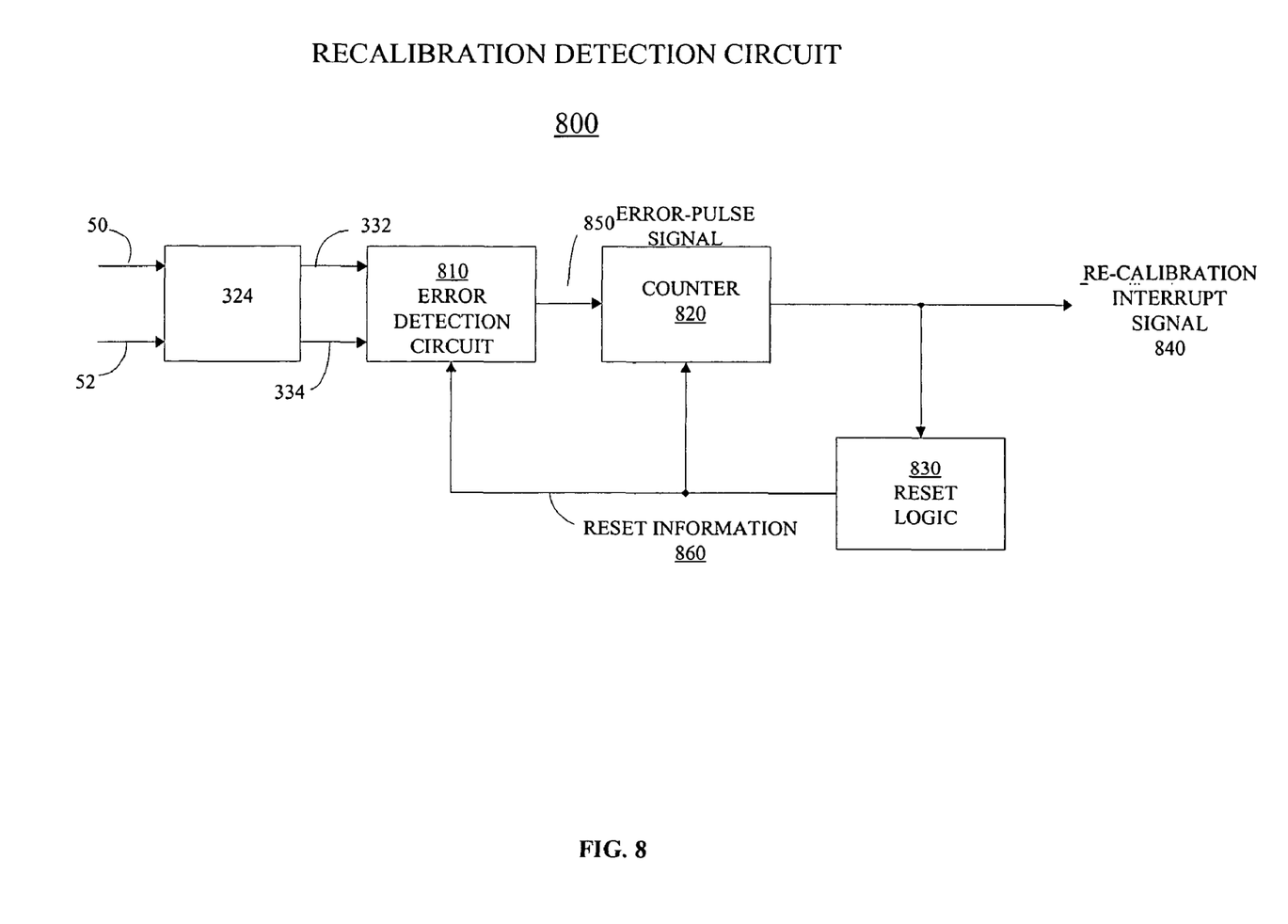
FIG. 8 is a block diagram of a recalibration detection circuit according to one exemplary embodiment of the invention.

FIG. 8 is a block diagram of a recalibration detection circuit 800 including an error detection circuit 810, a counter 820 and a reset circuit 830. The recalibration detection circuit 800 dynamically senses the phase skew between the skew compensated first differential output signal 50 and the skew compensated second differential output signal 52. By determining phase skew direction error accumulated during data transmission, the recalibration detection circuit 800 forces receiver training when accumulation overflows. According to one embodiment, the skew adjust control circuit 322 and/or the counter 820 counts the number of times a change of phase skew direction occurs via the error detection circuit 810. To avoid data transmission errors, a re-calibration interrupt signal 840 produced by counter 820 forces the system into re-training.

Figure 9:
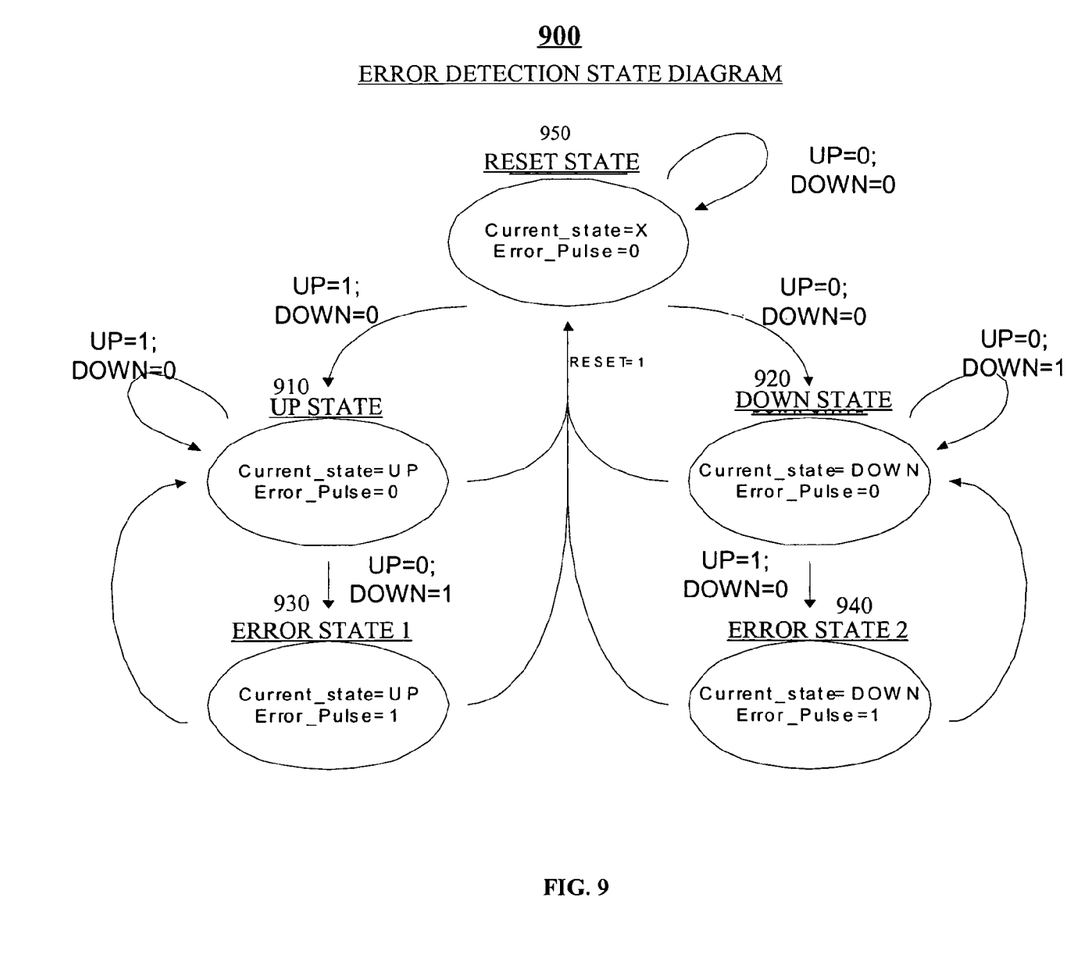
FIG. 9 is a state diagram of an error detection circuit according to one exemplary embodiment of the invention.

FIG. 9 illustrates an error detection state diagram 900 corresponding with the recalibration circuit 800. In response to receiving an error pulse signal 850, the reset logic 830 transitions from an upstate 910 or downstate 920 to the respective error states 930, 940, or to the reset state 950. In response to the reset state 950, the reset logic 830 generates reset information 860 and intra-pair skew calibration occurs as previously described.

The inverting input equalizer 310 shown in FIG. 3 may be optionally included in order to increase the high frequency component of the inverting input signal 44 to provide an equalized inverting input signal 336 to the inverting skew adjust circuit 318. Similarly, the noninverting input equalizer 312 increases the high frequency component of the noninverting input signal 42, and in response provides an equalized noninverting input signal 338. As is known in the art, the inverting input equalizer 310 and the noninverting input equalizer 312 increase the high frequency component of their respective input signal to enhance, for example, the positive and negative edge transitions of the received signals, in order to further facilitate accurate skew adjustment on either the non-inverting input or the inverting input.

Figure 4:
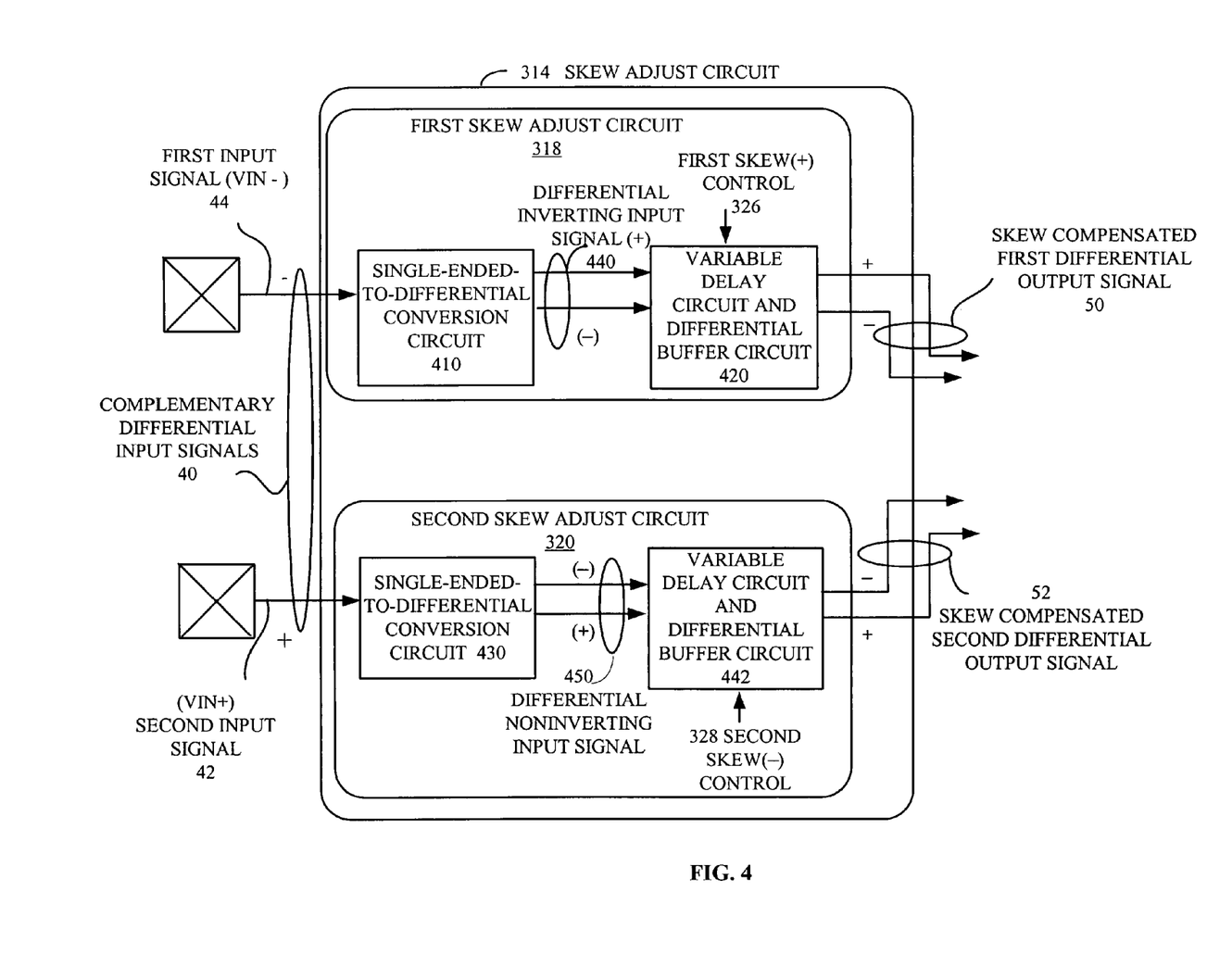
FIG. 4 is a block diagram of a skew adjust circuit according to one exemplary embodiment of the invention.

FIG. 4 is a more detailed block diagram of the inverting skew adjust circuit 318 and the noninverting skew adjust circuit 320. The inverting skew adjust circuit 318 includes a single-ended-to-differential conversion circuit 410 and a variable delay circuit and differential buffer circuit 420. Similarly, the noninverting skew adjust circuit 320 includes a single-ended-to-differential conversion circuit 430 and a variable delay circuit and differential buffer circuit 442. The inverting skew adjust circuit 318 and the noninverting skew adjust circuit 320 operate concurrently and independently on the complementary differential input signals 40. The single-ended-to-differential conversion circuits 410, 430 converts the corresponding single-ended signals-to-differential signals 440, 450 as shown in the single-ended to differential conversion timing diagram 620 and is known in the art.

Figure 5:
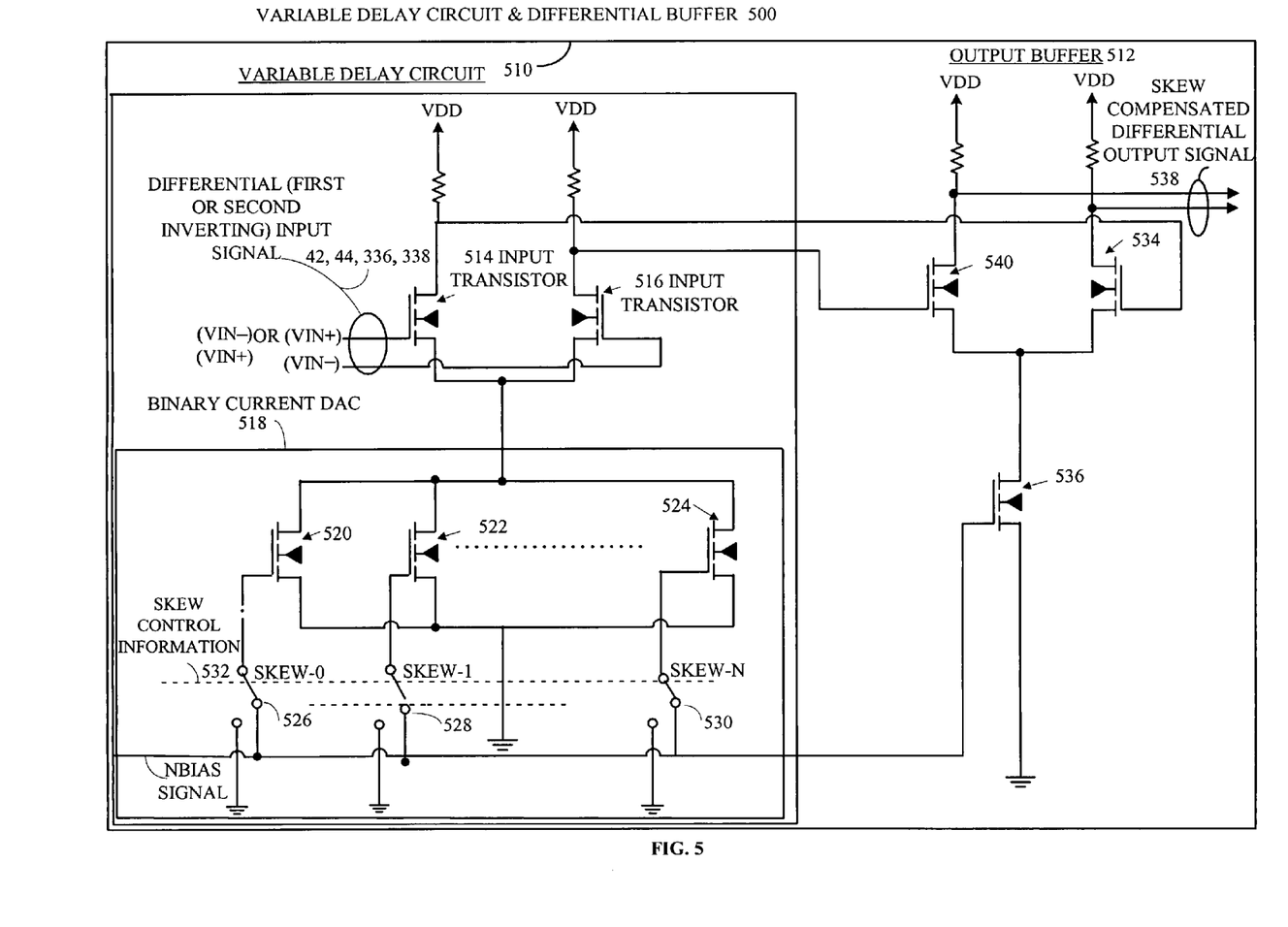
FIG. 5 is a schematic diagram of a variable delay circuit and buffer according to one exemplary embodiment of the invention.

FIG. 5 is a schematic diagram of a variable delay circuit and differential buffer 500, further including a variable delay circuit 510 and an output buffer 512. The variable delay circuit and differential buffer 500 described in FIG. 5 shows the variable delay circuits and differential buffers 420, 442 in more detail. The variable delay circuit 510 further includes input transistors 514, 516 and a binary current digital-to-analog converter (DAC) 518. The binary current digital-to-analog converter 518 further includes skew-0 transistor 520, skew-1 transistor 522, etc., up to skew-N transistor 524, skew-0 switch 526, skew-1 switch 528, etc., up to skew-N switch 530. Skew control information 532 controls switches 526, 528 and 530 for controlling the differential drive strength of the variable delay circuit 510, thereby controlling the amount of delay. Any suitable number of transistors and switches, N, may be used in order to provide a suitable number of incremental time delays. Output buffer 512 includes output transistors 540, 534 and 536. The output buffer 512 outputs the skew compensated differential output signal 538 as is known in the art.

Among other advantages, the differential serial communication receiver circuit 10 compensates for problems and disturbances which result in intrapair skew. By adapting to these problems and disturbances associated with the pair of complementary differential input signals 40, such as electromagnetic interference, and other causes of an imbalance in the pair of complementary differential input signals 40, data transmission errors may be reduced. Additionally, the differential serial communication receiver circuit 10 may allow the length of the differential communication link to be increased in order to permit communication over longer distances. Furthermore, the pair of wires or any suitable cable does not require strict intrapair skew characteristics, resulting in lower manufacturing costs for the cable and the overall system.

It is understood that the implementation of other variations and modifications of the present invention and its various aspects will be apparent to those of ordinary skill in the art and that the invention is not limited by the specific embodiments described. It is therefore contemplated to cover by the present invention any and all modifications, variations or equivalents that fall within the spirit and scope of the basic underlying principles disclosed and claimed herein.

The invention claimed is:

1. A differential serial communication circuit, comprising:
a differential skew compensation circuit operative, when in a receiver training mode, to generate a skew compensated first differential output signal and second differential output signal by delaying either a first input signal and/or a second input signal of a received pair of complementary differential input signals.

2. The differential serial communication circuit of claim 1, further operative to:
detect a phase delay between the skew compensated first differential output signal and the skew compensated second differential output signal; and
delay at least one of: the first input signal and the second input signal to reduce the resulting phase delay between the skew compensated first differential output signal and the skew compensated second differential output signal.

3. The differential serial communication circuit of claim 1, wherein the differential skew compensation circuit is operative to:
delay the second input signal when the compared skew compensated first differential output signal is delayed relative to the skew compensated second differential output signal; and
delay the first input signal when the compared skew compensated second differential output signal is delayed relative to the received skew compensated first differential output signal.

4. The differential serial communication circuit of claim 1, wherein the differential skew compensation circuit is operative to:
delay at least one of: the first input signal and the second input signal, such that a phase skew between the skew compensated first differential output signal and the skew compensated second differential output signal is within a phase skew threshold.

5. An integrated circuit comprising:
a differential skew compensation circuit operative, when in a receiver training mode, to generate a skew compensated first differential output signal and second differential output signal by delaying either a first input signal and/or a second input signal of a received pair of complementary differential input signals.

6. The integrated circuit of claim 5, further operative to:
detect a phase delay between the skew compensated first differential output signal and the skew compensated second differential output signal; and
delay at least one of: the first input signal and the second input signal to reduce the resulting phase delay between the skew compensated first differential output signal and the skew compensated second differential output signal.

7. The integrated circuit of claim 5, wherein the differential skew compensation circuit is operative to:
delay the second input signal when the compared skew compensated first differential output signal is delayed relative to the skew compensated second differential output signal; and
delay the first input signal when the compared skew compensated second differential output signal is delayed relative to the received skew compensated first differential output signal.

8. The integrated circuit of claim 5, wherein the differential skew compensation circuit is operative to:
delay at least one of: the first input signal and the second input signal, such that a phase skew between the skew compensated first differential output signal and the skew compensated second differential output signal is within a phase skew threshold.

9. A differential skew compensation method comprising:
generating a skew compensated first differential output signal and second differential output signal by delaying either a first input signal and/or a second input signal of a received pair of complementary differential input signals, as a receiver training operation.

10. The differential skew compensation method of claim 9, further comprising:
detecting a phase delay between the skew compensated first differential output signal and the skew compensated second differential output signal; and
delaying at least one of: the first input signal and the second input signal to reduce the resulting phase delay between the skew compensated first differential output signal and the skew compensated second differential output signal.

11. The differential skew compensation method of claim 9, further comprising:
delaying the second input signal when the compared skew compensated first differential output signal is delayed relative to the skew compensated second differential output signal; and
delaying the first input signal when the compared skew compensated second differential output signal is delayed relative to the received skew compensated first differential output signal.

12. The differential skew compensation method of claim 9, further comprising:
delaying at least one of: the first input signal and the second input signal, such that a phase skew between the skew compensated first differential output signal and the skew compensated second differential output signal is within a phase skew threshold.

* * * * *